(12) United States Patent
Li (10) Patent No.: US 10,290,262 B2
(45) Date of Patent: May 14, 2019

(54) SCANNING DRIVE CIRCUIT AND FLAT DISPLAY DEVICE

(71) Applicant: Wuhan China Star Optoelectronics Technology Co., Ltd., Wuhan, Hubei (CN)

(72) Inventor: Yafeng Li, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 242 days.

(21) Appl. No.: 15/304,497

(22) PCT Filed: Sep. 18, 2016

(86) PCT No.: PCT/CN2016/099220
§ 371 (c)(1),
(2) Date: Oct. 14, 2016

(87) PCT Pub. No.: WO2018/018723
PCT Pub. Date: Feb. 1, 2018

(65) Prior Publication Data
US 2018/0182299 A1    Jun. 28, 2018

(30) Foreign Application Priority Data

Jul. 28, 2016   (CN) .......................... 2016 1 0606528

(51) Int. Cl.
*G09G 3/3266* (2016.01)
*G09G 3/36* (2006.01)
(Continued)

(52) U.S. Cl.
CPC ............. *G09G 3/3266* (2013.01); *G09G 3/20* (2013.01); *G09G 3/3674* (2013.01); *G11C 19/28* (2013.01);
(Continued)

(58) Field of Classification Search
CPC ............... G09G 3/3266; G09G 3/3674; G09G 2310/0283
See application file for complete search history.

(56) References Cited

U.S. PATENT DOCUMENTS

2007/0297559 A1* 12/2007 Cho ..................... G09G 3/3677
377/64
2009/0086116 A1* 4/2009 Pak ...................... G09G 3/3655
349/38

(Continued)

FOREIGN PATENT DOCUMENTS

| CN | 103680450 A | 3/2014 |
| CN | 105632564 A | 6/2016 |
| KR | 1020090110483 A | 10/2009 |

*Primary Examiner* — Ryan A Lubit
(74) *Attorney, Agent, or Firm* — Andrew C. Cheng (57) ABSTRACT

The present disclosure provides a scanning drive circuit and a flat display device, the scanning drive circuit includes a plurality of cascaded scanning driving units, each scanning driving unit includes a forward-reverse scanning circuit used to control the forward scan and the reverse scan; a input circuit used to charge the pull-up and pull-down control signal point; a charge compensating circuit used to compensating charge the pull-up and pull-down control signal point; a output circuit generating the scanning driving signal to the present scanning line driving the pixel unit.

10 Claims, 5 Drawing Sheets

(51) Int. Cl.
 *G09G 3/20* (2006.01)
 *G11C 19/28* (2006.01)
(52) U.S. Cl.
 CPC ........... *G09G 2310/0267* (2013.01); *G09G 2310/0283* (2013.01); *G09G 2310/0286* (2013.01)

(56) References Cited

U.S. PATENT DOCUMENTS

| | | |
|---|---|---|
| 2009/0128541 A1 | 5/2009 | Tsai et al. |
| 2011/0157124 A1* | 6/2011 | Jung ................. G11C 19/28 345/211 |
| 2012/0229444 A1 | 9/2012 | Ochiai et al. |
| 2016/0071614 A1* | 3/2016 | Lee .................. G09G 5/006 345/214 |
| 2016/0372070 A1* | 12/2016 | Hu ................... G09G 3/3614 |

\* cited by examiner

SCANNING DRIVE CIRCUIT AND FLAT DISPLAY DEVICE

FIELD OF THE DISCLOSURE

The present disclosure relates to a display technology field, and more particularly to a scanning drive circuit and a flat display device having the same.

BACKGROUND OF THE DISCLOSURE

The current flat display device using the scanning drive circuit, which is the use of existing thin-film transistor array of flat panel display manufacturing process will formed the scanning drive circuit on the array substrate, to achieve the progressive scan drive. The existing scanning drive circuit will arranged a pull-up control signal point and a pull-down control signal point in the circuit, however, when increasing the conventional scanning drive circuit including the cascade scanning driving unit series, the upper and lower transmission signal will be attenuated, it will cause the precharge capacity of a certain level of the scanning driving unit to the pull-up control signal point insufficient, which led to the output capacity of the present level scanning line attenuated, affecting the output stability of the scanning drive circuit.

SUMMARY OF THE DISCLOSURE

The main technical problem of the present disclosure solved is providing a scanning drive circuit and a flat display device having the same to compensate the precharge of the pull-up control signal point, so as to ensure the output stability of the scanning drive circuit.

To solve the above technical problems, one aspect of the present disclosure used is: providing a scanning drive circuit, the scanning drive circuit includes a plurality of cascaded scanning driving units, each scanning driving unit includes:

a forward-reverse scanning circuit used to receive a first upper scanning signal and a first clock signal and output a first control signal to control the forward scanning of the scanning drive circuit, or used to receive a first lower scanning signal and a second clock signal and output a second control signal to control the reverse scanning of the scanning drive circuit;

an input circuit connecting the forward-reverse scanning circuit used to receive the first and second control signal from the forward-reverse scanning circuit and charge a pull-up control signal point and a pull-down control signal point according to the first and second control signal;

a charge compensating circuit connecting the input circuit used to receive a third control signal or a fourth control signal and compensating charge the pull-up control signal point and the pull-down control signal point according to the third and fourth control signal;

and a output circuit connecting the input circuit used to process the received third clock signal and the data of the input circuit received to generate a scanning driving signal, the scanning driving signal being outputted to a present level scanning line for driving a pixel unit;

Wherein, the third control signal includes a second upper scanning signal and a second lower scanning signal, the fourth control signal includes the first upper scanning signal and the first lower scanning signal.

Wherein, the forward-reverse scanning circuit includes a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal.

To solve the above technical problems, one aspect of the present disclosure used is: providing a scanning drive circuit, the scanning drive circuit includes a plurality of cascaded scanning driving units, each scanning driving unit includes:

a forward-reverse scanning circuit used to receive a first upper scanning signal and a first clock signal and output a first control signal to control the forward scanning of the scanning drive circuit, or used to receive a first lower scanning signal and a second clock signal and output a second control signal to control the reverse scanning of the scanning drive circuit;

an input circuit connecting the forward-reverse scanning circuit used to receive the first and second control signal from the forward-reverse scanning circuit and charge a pull-up control signal point and a pull-down control signal point according to the first and second control signal;

a charge compensating circuit connecting the input circuit used to receive a third control signal or a fourth control signal and compensating charge the pull-up control signal point and the pull-down control signal point according to the third or fourth control signal;

and a output circuit connecting the input circuit used to process the received third clock signal and the data of the input circuit received to generate a scanning driving signal outputting to a present level scanning line driving a pixel unit.

Wherein, the third control signal includes a second upper scanning signal and a second lower scanning signal, the fourth control signal includes the first upper scanning signal and the first lower scanning signal.

Wherein, the forward-reverse scanning circuit includes a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal.

Wherein, the input circuit includes third to seventh controllable switches and a first capacitor, the control terminal of the third controllable switch receives an open voltage terminal signal and connects the charge compensating circuit, the first terminal of the third controllable switch connects the control terminal of the fourth controllable switch, the second terminal of the first controllable switch, the first terminal of the second controllable switch and the charge compensating circuit, the second terminal of the third controllable switch connects the first terminal of the fifth controllable switch and the output circuit, the second terminal of the fifth controllable switch connects the second terminal of the fourth controllable switch and the second terminal of the seventh controllable switch and receives a close voltage terminal signal, the control terminal of the fifth controllable switch connects the first terminal of the fourth controllable switch, the control terminal of the seventh controllable switch and the first terminal of the sixth controllable switch, the control terminal of the sixth controllable switch connects the second terminal of the sixth controllable switch and the output circuit, the first terminal of the seventh controllable switch connects the output circuit, the first capacitor is connected between the control terminal and the second terminal of the seventh controllable switch.

Wherein, the output circuit includes an eighth controllable switch and a second capacitor, the control terminal of the eighth controllable switch connects the second terminal of the third controllable switch and the first terminal of the fifth controllable switch, the first terminal of the eighth controllable switch connects the control terminal of the sixth controllable switch and the second terminal of the sixth controllable switch and receives the third clock signal, the second terminal of the eighth controllable switch connects the first terminal of the seventh controllable switch and the present level scanning line, the second capacitor is connected between the control terminal of the eighth controllable switch and the second terminal of the eighth controllable switch.

Wherein, the charge compensating circuit includes a ninth controllable switch and a tenth controllable switch, the control terminal of the ninth controllable switch receives the second upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch receives the second lower scanning signal.

Wherein, the first to tenth controllable switches are N-type thin film transistors, the control terminal, the first terminal and the second terminal of the first to tenth controllable switches are respectively corresponded the gate electrode, the drain electrode and the source electrode of the N-type thin film transistors.

Wherein, the charge compensating circuit includes a ninth controllable switch and a tenth controllable switch, the control terminal of the ninth controllable switch connects the first terminal of the first controllable switch and receives the first upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch connects the second terminal of the second controllable switch and receives the first lower scanning signal.

Wherein, the first to tenth controllable switches are N-type thin film transistors, the control terminal, the first terminal and the second terminal of the first to tenth controllable switches are respectively corresponded the gate electrode, the drain electrode and the source electrode of the N-type thin film transistors.

To solve the above technical problems, another aspect of the present disclosure used is: providing a flat display device, the flat display device includes a scanning drive circuit, the scanning drive circuit includes a plurality of cascaded scanning driving units, and each scanning driving unit includes:

a forward-reverse scanning circuit used to receive a first upper scanning signal and a first clock signal and output a first control signal to control the forward scanning of the scanning drive circuit, or used to receive a first lower scanning signal and a second clock signal and output a second control signal to control the reverse scanning of the scanning drive circuit;

an input circuit connecting the forward-reverse scanning circuit used to receive the first and second control signal from the forward-reverse scanning circuit and charge a pull-up control signal point and a pull-down control signal point according to the first and second control signal;

a charge compensating circuit connecting the input circuit used to receive a third control signal or a fourth control signal and compensating charge the pull-up control signal point and the pull-down control signal point according to the third and fourth control signal;

and a output circuit connecting the input circuit used to process the received third clock signal and the data of the input circuit received to generate a scanning driving signal, the scanning driving signal being outputted to a present level scanning line for driving a pixel unit.

Wherein, the third control signal includes a second upper scanning signal and a second lower scanning signal, the fourth control signal includes the first upper scanning signal and the first lower scanning signal.

Wherein, the forward-reverse scanning circuit includes a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal.

Wherein, the input circuit includes third to seventh controllable switches and a first capacitor, the control terminal of the third controllable switch receives an open voltage terminal signal and connects the charge compensating circuit, the first terminal of the third controllable switch connects the control terminal of the fourth controllable switch, the second terminal of the first controllable switch, the first terminal of the second controllable switch and the charge compensating circuit, the second terminal of the third controllable switch connects the first terminal of the fifth controllable switch and the output circuit, the second terminal of the fifth controllable switch connects the second terminal of the fourth controllable switch and the second terminal of the seventh controllable switch and receives a close voltage terminal signal, the control terminal of the fifth controllable switch connects the first terminal of the fourth controllable switch, the control terminal of the seventh controllable switch and the first terminal of the sixth controllable switch, the control terminal of the sixth controllable switch connects the second terminal of the sixth controllable switch and the output circuit, the first terminal of the seventh controllable switch connects the output circuit, the first capacitor is connected between the control terminal and the second terminal of the seventh controllable switch.

Wherein, the output circuit includes an eighth controllable switch and a second capacitor, the control terminal of the eighth controllable switch connects the second terminal of the third controllable switch and the first terminal of the fifth controllable switch, the first terminal of the eighth controllable switch connects the control terminal of the sixth controllable switch and the second terminal of the sixth controllable switch and receives the third clock signal, the second terminal of the eighth controllable switch connects the first terminal of the seventh controllable switch and the present level scanning line, the second capacitor is connected between the control terminal of the eighth controllable switch and the second terminal of the eighth controllable switch.

Wherein, the charge compensating circuit includes a ninth controllable switch and a tenth controllable switch, the control terminal of the ninth controllable switch receives the second upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch receives the second lower scanning signal.

Wherein, the first to tenth controllable switches are N-type thin film transistors, the control terminal, the first terminal and the second terminal of the first to tenth controllable switches are respectively corresponded the gate electrode, the drain electrode and the source electrode of the N-type thin film transistors.

Wherein, the charge compensating circuit includes a ninth controllable switch and a tenth controllable switch, the control terminal of the ninth controllable switch connects the first terminal of the first controllable switch and receives the first upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch connects the second terminal of the second controllable switch and receives the first lower scanning signal.

Wherein, the first to tenth controllable switches are N-type thin film transistors, the control terminal, the first terminal and the second terminal of the first to tenth controllable switches are respectively corresponded the gate electrode, the drain electrode and the source electrode of the N-type thin film transistors.

The beneficial effects of the present disclosure are: the situation is different from the prior art, the scanning drive circuit of the present disclosure controls the forward scan and reverse scan through the forward-reverse scanning circuit, and charging the pull-up control signal and the pull-down control signal through the input circuit, through the charge compensating circuit to compensating charge the pull-up control signal point and the pull-down control signal point, finally, output the scanning driving signal generated by the output circuit to the scan line driving the pixel unit, in order to achieve the compensation of the precharge of the scanning driving unit through the charge compensating circuit to the pull-up control signal point, thus ensuring the output stability of the scanning drive circuit.

DETAILED DESCRIPTION OF PREFERRED EMBODIMENTS

Figure 1:
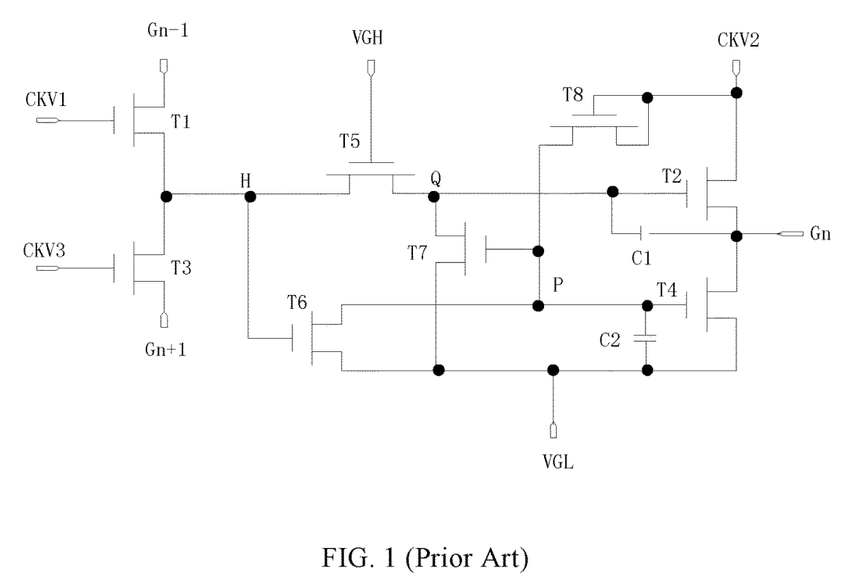
FIG. 1 is a structure schematic diagram of a scanning driving unit of the scanning drive circuit in the prior art.
Figure 2:
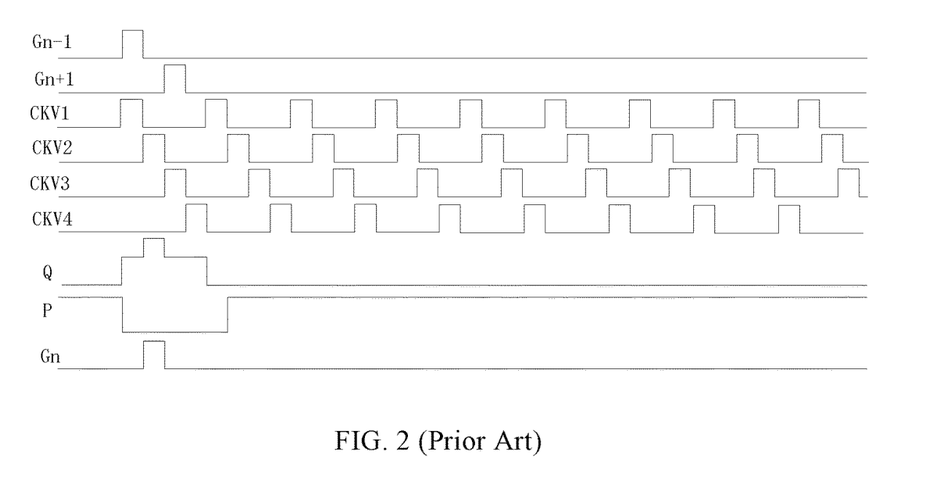
FIG. 2 is a forward scan waveform diagram of FIG. 1.

Refer to FIG. 1 and FIG. 2, the scanning drive circuit works (forward scan) in the prior art as follows:

Precharge phase: when the upper scanning signal Gn−1 and the clock signal CKV1 are high level at the same time, thin film transistor T1 is turned on and the pull-up control signal point Q is precharged, when the pull-up control signal point Q is high level, the thin film transistor T6 is in a conducting state and the pull-down control signal point P is pulled low;

The present level scanning line Gn outputting high level phase: the gate electrode of the thin film transistor T5 receives the open voltage terminal signal VGH has been in the conducting state, in the precharge phase, the pull-up control signal point Q is precharged, the capacitor C1 has a certain holding function to the charge, so that the thin film transistor T2 is in the conducting state and the high level of the clock signal CKV2 outputs to the present level scanning line Gn;

The present level scanning line Gn outputting low level phase: when the clock signal CKV3 and the lower scanning signal Gn+1 are high level at the same time, the pull-up control signal point Q is kept in high level, by this time the low level of the clock signal CKV2 pulling down the electric potential of the present level scanning line Gn;

The pull-up control signal point Q pulled down to the close voltage terminal signal VGL phase: when the clock signal CKV1 be high level again, the upper scanning signal Gn−1 is low level, the thin film transistor T1 is in the conducting state and the pull-up control signal point Q is pulled down to the close voltage terminal signal VGL;

The pull-up control signal point Q and the present level scanning line Gn in the low level maintenance phase: after the pull-up control signal point Q became low level, the thin film transistor T6 is in the off state, after the clock signal CKV2 became high level, the thin film transistor T8 is turned on, the pull-down control signal point P becomes the high level and the thin film transistor T4 and T7 are in the conducting state to ensure the stability of the pull-up control signal point Q and the low level of the present level scanning line Gn and the capacitor C2 maintaining the high level of the pull-down control signal point P.

Figure 3:
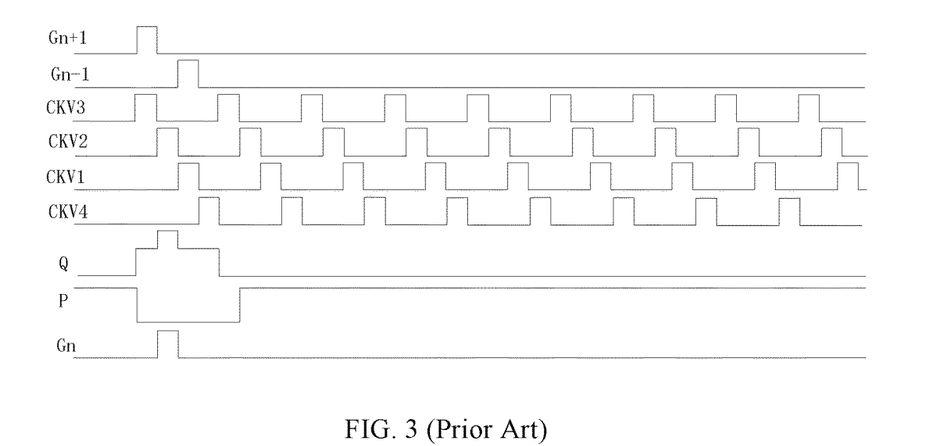
FIG. 3 is a reverse scan waveform diagram of FIG. 1.

Please refer to FIG. 1 and FIG. 3, the scanning drive circuit works (reverse scan) in the prior art as follows:

Precharge phase: when the lower scanning signal Gn+1 and the clock signal CKV3 are high level at the same time, the thin film transistor T3 is turned on and the pull-up control signal point Q is precharged, when the pull-up control signal point Q is high level, the thin film transistor T6 is in the conducting state and the pull-down control signal point P is pulled down;

The present level scanning line Gn outputting high level phase: the gate electrode of the thin film transistor T5 receives the open voltage terminal signal VGH has been in the conducting state, in the precharge phase, the pull-up control signal point Q is precharged, the capacitor C1 has a certain holding function to the charge, so that the thin film transistor T2 is in the conducting state and the high level of the clock signal CKV2 outputs to the present level scanning line Gn;

The present level scanning line Gn outputting the low level phase: when the clock signal CKV1 and the upper scanning signal Gn−1 are high level at the same time, the pull-up control signal point Q is kept in high level, by this time the low level of the clock signal CKV2 pulling down the electric potential of the present level scanning line Gn;

The pull-up control signal point Q pulled down to the close voltage terminal signal VGL phase: when the clock signal CKV3 becomes the high level again, the lower scanning signal Gn+1 is low level, the thin film transistor T3 is in the conducting state, the pull-up control signal point Q is pulled down to the close voltage terminal signal VGL;

The pull-up control signal point Q and the present level scanning line Gn in the low level maintenance phase: after the pull-up control signal point Q became low level, the thin film transistor T6 is in the off state, after the clock signal CKV2 became high level, the thin film transistor T8 is turned on, the pull-down control signal point P becomes the high level and the thin film transistor T4 and T7 are in the conducting state to ensure the stability of the pull-up control signal point Q and the low level of the present level scanning line Gn and the capacitor C2 maintaining the high level of the pull-down control signal point P. the remaining scanning driving unit works are the same as above, will not repeat.

When the existing scanning drive circuit forward scanning, the precharge of the pull-up control signal point Q is mainly achieved by the thin film transistor T1, when reverse scanning, the precharge of the pull-up control signal point Q is mainly achieved by the thin film transistor T3, however, when increasing the conventional scanning drive circuit including the cascade scanning driving unit series, the upper and lower transmission signal will be attenuated, it will cause the precharge capacity of a certain level of the scanning driving unit to the pull-up control signal point Q insufficient, which led to the output capacity of the present level scanning line attenuated, affecting the output stability of the scanning drive circuit.

Figure 4:
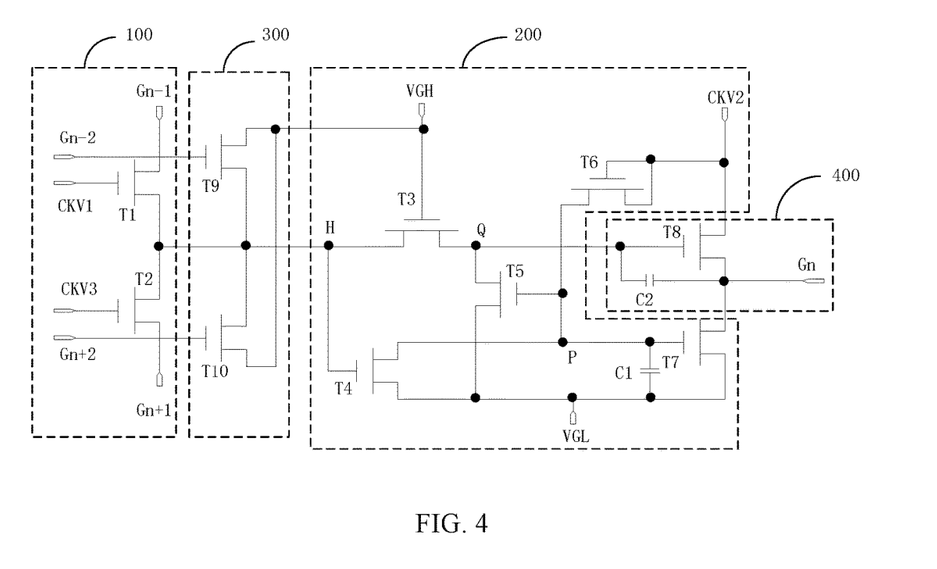
FIG. 4 is a structure schematic diagram of the first embodiment of the scanning driving unit of the scanning drive circuit of the present disclosure.

Please refer to FIG. 4, FIG. 4 is a structure schematic diagram of the first embodiment of the scanning driving unit of the scanning drive circuit of the present disclosure. In the present embodiment, only use a scanning driving unit as an example. As shown in FIG. 4, the scanning drive circuit of the present disclosure includes a plurality of cascaded scanning driving units, each scanning driving unit includes a forward-reverse scanning circuit 100 used to receive a first upper scanning signal and a first clock signal and output a first control signal to control the forward scanning of the scanning drive circuit, or used to receive a first lower scanning signal and a second clock signal and output a second control signal to control the reverse scanning of the scanning drive circuit;

an input circuit 200 connecting the forward-reverse scanning circuit 100 used to receive the first and second control signal from the forward-reverse scanning circuit 100 and charge a pull-up control signal point and a pull-down control signal point according to the first and second control signal;

a charge compensating circuit 300 connecting the input circuit 200 used to receive a third control signal or a fourth control signal and compensating charge the pull-up control signal point and the pull-down control signal point according to the third and fourth control signal;

and a output circuit 400 connecting the input circuit 200 used to process the received third clock signal and the data of the input circuit 200 received to generate a scanning driving signal, the scanning driving signal being outputted to a present level scanning line for driving a pixel unit. Wherein, in the first embodiment, the third control signal includes a second upper scanning signal and a second lower scanning signal; in the second embodiment, the fourth control signal includes the first upper scanning signal and the first lower scanning signal.

The forward-reverse scanning circuit 100 includes a first controllable switch and a second controllable switch T1, T2, the control terminal of the first controllable switch T1 receives the first clock signal, the first terminal of the first controllable switch T1 receives the first upper scanning signal, the second terminal of the first controllable switch T1 connects the first terminal of the second controllable switch T2 and the input circuit 200, the control terminal of the second controllable switch T2 receives the second clock signal, the second terminal of the second controllable switch T2 receives the first lower scanning signal.

The input circuit 200 includes third to seventh controllable switches T3-T7 and a first capacitor C1, the control terminal of the third controllable switch T3 receives an open voltage terminal signal VGH and connects the charge compensating circuit 300, the first terminal of the third controllable switch T3 connects the control terminal of the fourth controllable switch T4, the second terminal of the first controllable switch T1, the first terminal of the second controllable switch T2 and the charge compensating circuit 300, the second terminal of the third controllable switch T3 connects the first terminal of the fifth controllable switch T5 and the output circuit 400, the second terminal of the fifth controllable switch T5 connects the second terminal of the fourth controllable switch T4 and the second terminal of the seventh controllable switch T7 and receives a close voltage terminal signal VGL, the control terminal of the fifth controllable switch T5 connects the first terminal of the fourth controllable switch T4, the control terminal of the seventh controllable switch T7 and the first terminal of the sixth controllable switch T6, the control terminal of the sixth controllable switch T6 connects the second terminal of the sixth controllable switch T6 and the output circuit 400, the first terminal of the seventh controllable switch T7 connects the output circuit 400, the first capacitor C1 is connected between the control terminal and the second terminal of the seventh controllable switch T7.

The output circuit 400 includes an eighth controllable switch T8 and a second capacitor C2, the control terminal of the eighth controllable switch T8 connects the second terminal of the third controllable switch T3 and the first terminal of the fifth controllable switch T5, the first terminal of the eighth controllable switch T8 connects the control terminal of the sixth controllable switch T6 and the second terminal of the sixth controllable switch T6 and receives the third clock signal, the second terminal of the eighth controllable switch T8 connects the first terminal of the seventh controllable switch T7 and the present level scanning line, the second capacitor C2 is connected between the control terminal of the eighth controllable switch T8 and the second terminal of the eighth controllable switch T8.

The charge compensating circuit 300 includes a ninth controllable switch T9 and a tenth controllable switch T10, the control terminal of the ninth controllable switch T9 receives the second upper scanning signal, the first terminal of the ninth controllable switch T9 connects the second terminal of the tenth controllable switch T10 and the control terminal of the third controllable switch T3 and receives the open voltage terminal signal VGH, the second terminal of the ninth controllable switch T9 connects the first terminal of the tenth controllable switch T10, the first terminal of the third controllable switch T3 and the control terminal of the fourth controllable switch T4, the control terminal of the tenth controllable switch T10 receives the second lower scanning signal.

Specifically, in the present embodiment, the first to tenth controllable switches T1-T10 are N-type thin film transistors, the control terminal, the first terminal and the second terminal of the first to tenth controllable switches T1-T10 are respectively corresponded the gate electrode, the drain electrode and the source electrode of the N-type thin film transistors. In other embodiment, the first to tenth controllable switch may also be other types of switches, as long as can be realized the object of the present disclosure.

Specifically, the first upper scanning signal is the first upper scanning signal Gn−1, the second upper scanning signal is the upper scanning signal Gn−2, the first lower scanning signal is the first lower scanning signal Gn+1, the second lower scanning signal is the second lower scanning signal Gn+2, the first clock signal is the clock signal CKV1, the second clock signal is the clock signal CKV3, the third clock signal is the clock signal CKV2, the pull-up control signal is the pull-up control signal point Q, the pull-down control signal point is the pull-down control signal point P.

Figure 5:
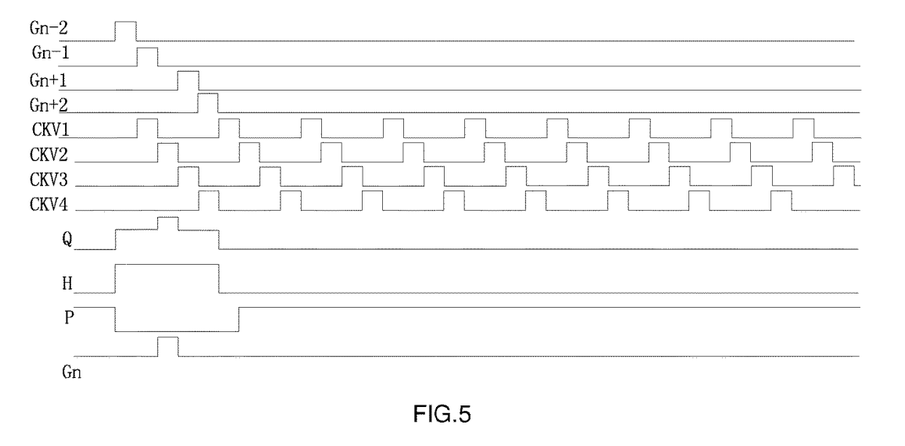
FIG. 5 is a forward scan waveform diagram of FIG. 4.

Please refer to FIG. 4 and FIG. 5, the scanning driving unit works (forward scan) of the scanning drive circuit as follows:

precharge phase: when the second lower scanning signal Gn−2 is high level, the ninth controllable switch T9 is turned on and the pull-up control signal point Q is precharged, when the first lower scanning signal Gn−1 and the first clock signal CKV1 are high level at the same time, the first controllable switch T1 is turned on, the fourth controllable switch T4 is in the conducting state and the pull-down control signal point P is pulled low;

the present level scanning line Gn outputting high level phase: the control terminal of the third controllable switch T3 receives the open voltage terminal signal VGH has been in the conducting state, in the precharge phase, the pull-up control signal point Q is precharged, the second capacitor C2 has a certain holding function to the charge, so that the eighth controllable switch T8 is in the conducting state and the high level of the third clock signal CKV3 outputs to the present level scanning line Gn;

the present level scanning line Gn outputting low level phase: when the second clock signal CKV3 and the lower scanning signal Gn+1 are high level at the same time, the pull-up control signal point Q is kept in high level, by this time the low level of the third clock signal CKV2 pulling down the electric potential of the present level scanning line Gn; when the second lower scanning signal Gn+2 is high level, the tenth controllable switch T10 is turned on, the pull-up control signal point Q is charged higher again, the eighth controllable switch T8 is opened more fully, the low level of the third clock signal CKV2 outputted keeps the present level scanning line Gn in the low level state;

the pull-up control signal point Q pulled down to the close voltage terminal signal VGL phase: when the first clock signal CKV1 be high level again, the first upper scanning signal Gn−1 is low level, the first thin film transistor T1 is in the conducting state and the pull-up control signal point Q is pulled down to the close voltage terminal signal VGL;

the pull-up control signal point Q and the present level scanning line Gn in the low level maintenance phase: after the pull-up control signal point Q became low level, the fourth thin film transistor T4 is in the off state, after the third clock signal CKV2 became high level, the sixth thin film transistor T6 is turned on, the pull-down control signal point P becomes the high level and the seventh thin film transistor T7 and the fifth thin film transistor T5 are in the conducting state to ensure the stability of the pull-up control signal point Q and the low level of the present level scanning line Gn and the first capacitor C1 maintaining the high level of the pull-down control signal point P.

Figure 6:
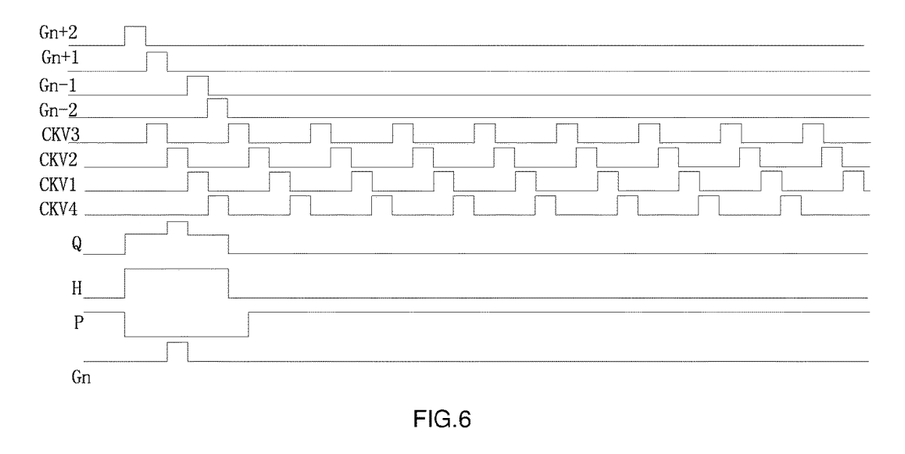
FIG. 6 is a reverse scan waveform diagram of FIG. 4.

Please refer to FIG. 4 and FIG. 6, the scanning driving unit works (reverse scan) of the scanning drive circuit as follows:

precharge phase: when the second lower scanning signal Gn+2 is high level, the tenth controllable switch is turned on and the pull-up control signal point Q is precharged, when the first lower scanning signal Gn+1 and the second clock signal CKV3 are high level, the second controllable switch T2 is turned on, the pull-down control signal point Q is precharged again, when the pull-down control signal Q is high level, the fourth controllable switch T4 is in the conducting state, the pull-down control signal point P is pulled down;

the present scanning line Gn outputting high level phase: the control terminal of the third controllable switch T3 receives the open voltage terminal signal VGH has been in the conducting state, in the precharge phase, the pull-up control signal point Q is precharged, the second capacitor C2 has a certain holding function to the charge, the eighth controllable switch T8 is in the conducting state, the high level of the third clock signal CKV2 outputs to the present level scanning line Gn;

the present scanning line Gn outputting low level phase: when the first clock signal CKV1 and the first upper scanning signal Gn−1 are high level at the same time, the pull-up control signal point Q is kept in high level, by this time the low level of the third clock signal CKV2 pulling down the electric potential of the present level scanning line Gn, when the second upper scanning signal Gn−2 is high level, the ninth controllable switch T9 is turned on, the pull-up control signal point Q is charged higher again, the eighth controllable switch T8 is opened more fully, the low level of the third clock signal CKV2 outputted keeps the present level scanning line Gn in the low level state;

the pull-up control signal point Q pulled down to the close voltage terminal VGL phase: when the second clock signal CKV3 be high level again, the first lower scanning signal Gn+1 is low level, the second controllable switch T2 is in the conducting state and the pull-up control signal point Q is pulled down to the close voltage terminal signal VGL;

the pull-up control signal point Q and the present level scanning line Gn in the low level maintenance phase: after the pull-up control signal point Q became low level, the fourth thin film transistor T4 is in the off state, after the third clock signal CKV2 became high level, the sixth thin film transistor T6 is turned on, the pull-down control signal point P becomes the high level and the seventh controllable switch T7 and the fifth controllable switch T5 are in the conducting state to ensure the stability of the pull-up control signal point Q and the low level of the present level scanning line Gn and the first capacitor C1 maintaining the high level of the pull-down control signal point P, so that the scanning driving unit compensates the precharge of the pull-up control signal point Q through the charge compensating circuit, so as to ensure the stability of the output of the scanning drive circuit.

Figure 7:
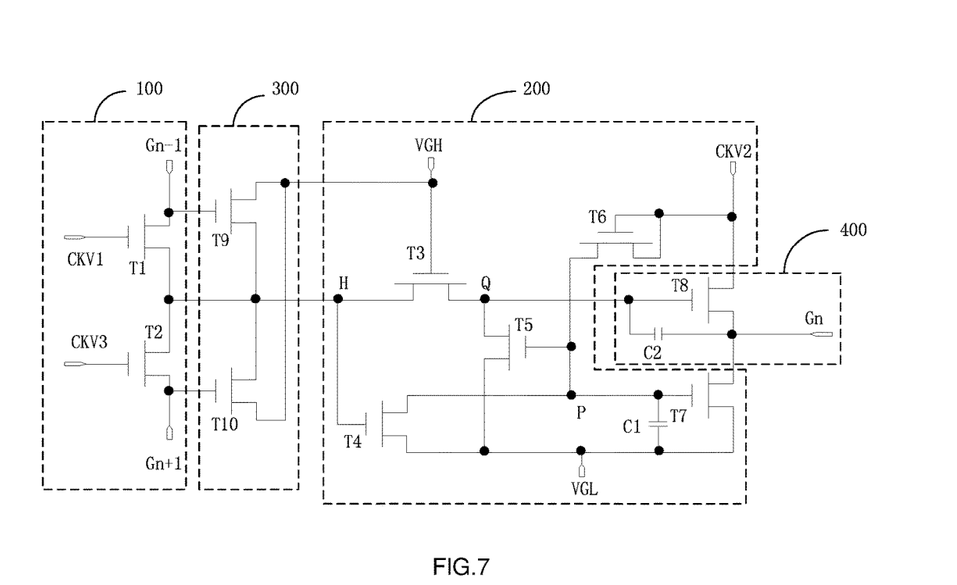
FIG. 7 is a structure schematic diagram of the second embodiment of the scanning driving unit of the scanning drive circuit of the present disclosure.

Please refer to FIG. 7, FIG. 7 is a structure schematic diagram of the second embodiment of the scanning driving unit of the scanning drive circuit of the present disclosure. The differences between the second embodiment and the first embodiment of the scanning drive circuit are: the compensating circuit 300 includes the ninth controllable switch T9 and the tenth controllable switch T10, the control terminal of the ninth controllable T9 connects the first terminal of the first controllable switch T1 and receives the first upper scanning signal, the first terminal of the ninth controllable switch T9 connects the second terminal of the tenth controllable switch T10 and the control terminal of the third controllable switch T3 and receives the open voltage terminal signal VGH, the second terminal of the ninth controllable switch T9 connects the first terminal of the tenth controllable switch T10, the first terminal of the third controllable switch T3 and the control terminal of the fourth controllable switch T4, the control terminal of the tenth controllable switch T10 connects the second terminal of the second controllable switch T2 and receives the first lower scanning signal.

Figure 8:
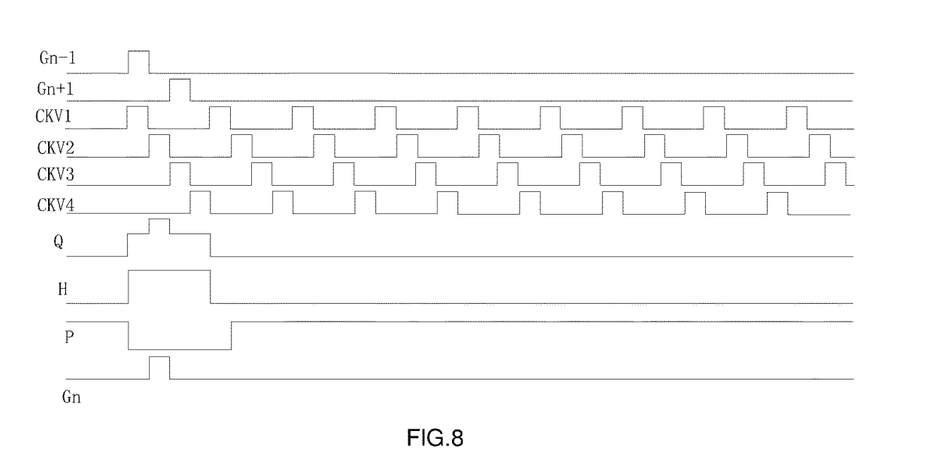
FIG. 8 is a forward scan waveform diagram of FIG. 7.

Please refer to FIG. 7 and FIG. 8, the scanning driving unit works (forward scan) of the scanning drive circuit as follows:

precharge phase: when the first upper scanning signal Gn−1 and the first clock signal are high level at the same time, the first controllable switch T1 is turned on and the pull-up control signal point Q is precharged, when the first upper scanning signal Gn−1 is high level, the ninth controllable switch T9 is turned on, the upper control signal point Q will be compensating charged, when the upper control signal point Q is high level, the fourth controllable switch T4 is in the conducting state and the pull-down control signal point P is pulled low;

the present level scanning line Gn outputting high level phase: the control terminal of the third controllable switch T3 receives the open voltage terminal signal VGH has been in the conducting state, in the precharge phase, the pull-up control signal point Q is precharged, the second capacitor C2 has a certain holding function to the charge, so that the eighth controllable switch T8 is in the conducting state and the high level of the third clock signal CKV2 outputs to the present level scanning line Gn;

the present level scanning line Gn outputting low level phase: when the second clock signal CKV3 and the lower scanning signal Gn+1 are high level at the same time, the pull-up control signal point Q is kept in high level, by this time the low level of the third clock signal CKV2 pulling down the electric potential of the present level scanning line Gn; when the first lower scanning signal Gn+1 is high level, the tenth controllable switch T10 is turned on, the pull-up control signal point Q is compensating charged again, the eighth controllable switch T8 is opened more fully, the low level of the third clock signal CKV2 outputted keeps the present level scanning line Gn in the low level state;

the pull-up control signal point Q pulling down to the close voltage terminal signal VGL phase: when the first clock signal CKV1 be high level again, the first upper scanning signal Gn−1 is low level, the first controllable switch T1 is in the conducting state and the pull-up control signal point Q is pulled down to the close voltage terminal signal VGL;

The pull-up control signal point Q and the present level scanning line Gn in the low level maintenance phase: after the pull-up control signal point Q became low level, the fourth thin film transistor T4 is in the off state, after the third clock signal CKV2 became high level, the sixth thin film transistor T6 is turned on, the pull-down control signal point P becomes the high level and the seventh thin film transistor T7 and the fifth thin film transistor T5 are in the conduction state to ensure the stability of the pull-up control signal point Q and the low level of the present level scanning line Gn and the first capacitor C1 maintaining the high level of the pull-down control signal point P.

Figure 9:
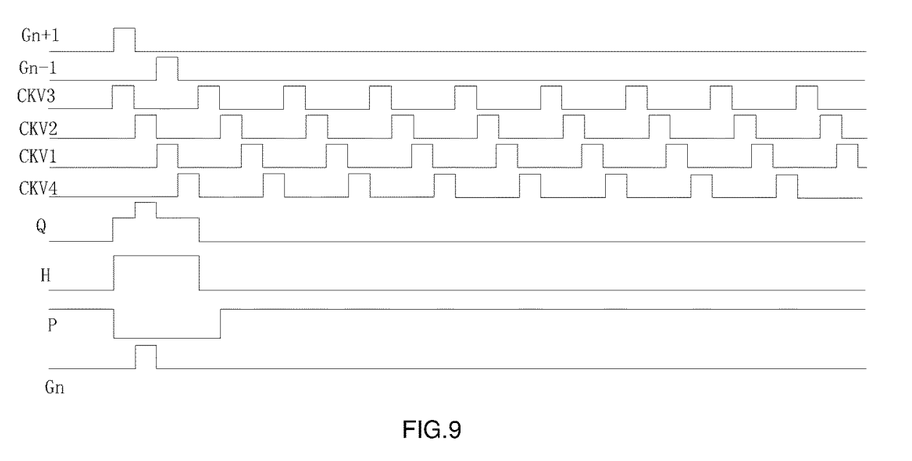
FIG. 9 is a reverse scan waveform diagram of FIG. 7.

Please refer to FIG. 7 and FIG. 9, the scanning driving unit works (reverse scan) of the scanning drive circuit as follows:

precharge phase: when the first lower scanning signal Gn+1 and the second clock signal CKV3 are high level at the same time, the second controllable switch T2 is turned on and the pull-up control signal point Q is precharged, when the first upper scanning signal Gn−1 is high level, the tenth controllable switch T10 is turned on, the pull-up control signal point Q will be compensating charged, when the pull-up control signal Q is high level, the fourth controllable switch T4 is in the conducting state, the pull-down control signal point P is pulled down;

the present scanning line Gn outputting high level phase: the control terminal of the third controllable switch T3 receives the open voltage terminal signal VGH has been in the conducting state, in the precharge phase, the pull-up control signal point Q is precharged, the second capacitor C2 has a certain holding function to the charge, the eighth controllable switch T8 is in the conducting state, the high level of the third clock signal CKV2 outputs to the present level scanning line Gn;

the present scanning line Gn outputting low level phase: when the first clock signal CKV1 and the first upper scanning signal Gn−1 are high level at the same time, the pull-up control signal point Q is kept in high level, by this time the low level of the third clock signal CKV2 pulling down the electric potential of the present level scanning line Gn, when the first upper scanning signal Gn−1 is high level, the ninth controllable switch T9 is turned on, the pull-up control signal point Q is compensating charged again, the eighth controllable switch T8 is opened more fully, the low level of the third clock signal CKV2 outputted keeps the present level scanning line Gn in the low level state;

the pull-up control signal point Q pulled down to the close voltage terminal VGL phase: when the second clock signal CKV3 be high level again, the first lower scanning signal Gn+1 is low level, the second controllable switch T2 is in the conducting state and the pull-up control signal point Q is pulled down to the close voltage terminal signal VGL;

The pull-up control signal point Q and the present level scanning line Gn in the low level maintenance phase: after the pull-up control signal point Q became low level, the fourth thin film transistor T4 is in the off state, after the third clock signal CKV2 became high level, the sixth controllable switch T6 is turned on, the pull-down control signal point P becomes the high level and the seventh controllable switch T7 and the fifth controllable switch T5 are in the conducting state to ensure the stability of the pull-up control signal point Q and the low level of the present level scanning line Gn and the first capacitor C1 maintaining the high level of the pull-down control signal point P, so that the scanning driving unit compensates the precharge of the pull-up control signal point Q through the charge compensating circuit, so as to ensure the stability of the output of the scanning drive circuit.

Figure 10:
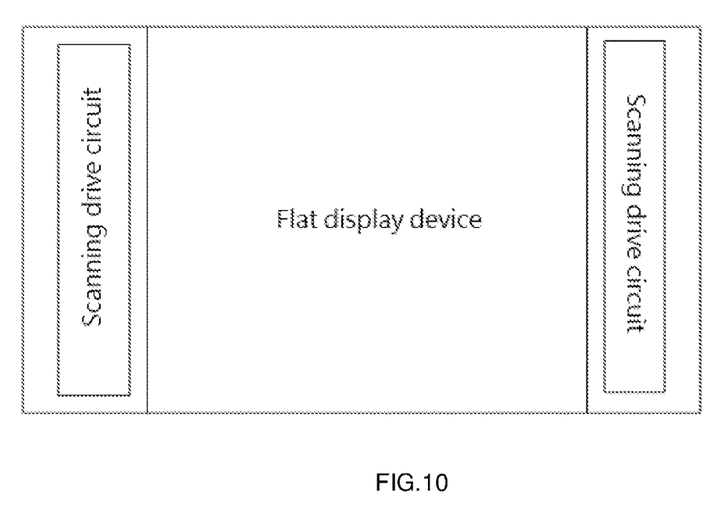
FIG. 10 is a schematic diagram of the flat display device of the present disclosure.

Please refer to FIG. 10, FIG. 10 is a schematic diagram of the flat display device of the present disclosure. The flat display device includes the scanning drive circuit described above, the scanning drive circuit is arranged both ends of the flat display device. Wherein, the flat display device is liquid crystal display (LCD) or organic light emitting diode (OLED). The other devices and functions of the flat display device are as same as the devices and functions of the existing flat display device, will not repeat.

The scanning drive circuit of the present disclosure controls the forward scan and reverse scan through the forward-reverse scanning circuit, and charging the pull-up control signal and the pull-down control signal through the input circuit, through the charge compensating circuit to compensating charge the pull-up control signal point and the pull-down control signal point, finally, output the scanning driving signal generated by the output circuit to the scan line driving the pixel unit, in order to achieve the compensation of the precharge of the scanning driving unit through the charge compensating circuit to the pull-up control signal point, thus ensuring the output stability of the scanning drive circuit.

The above are only embodiments of the present disclosure is not patented and therefore limit the scope of the present disclosure, the use of any content of the present specification and drawings made equivalent or equivalent structural transformation process, either directly or indirectly in other relevant technical fields are included in the same way the scope of patent protection of the present disclosure.

What is claimed is:

1. A scanning drive circuit, comprising a plurality of cascaded scanning driving units, wherein each scanning driving unit comprises:
    a forward-reverse scanning circuit used to receive a first upper scanning signal and a first clock signal and output a first control signal to control a forward scanning of the scanning drive circuit, or used to receive a first lower scanning signal and a second clock signal and output a second control signal to control a reverse scanning of the scanning drive circuit;
    an input circuit connecting the forward-reverse scanning circuit and used to receive the first and second control signal from the forward-reverse scanning circuit and charge a pull-up control signal point and a pull-down control signal point according to the first and second control signal;
    a charge compensating circuit connecting the input circuit and used to receive a third control signal and compensatingly charge the pull-up control signal point and the pull-down control signal point according to the third control signal; and
    an output circuit connecting the input circuit and used to process a received third clock signal and the data received from the input circuit to generate a scanning driving signal, the scanning driving signal being outputted to a present level scanning line for driving a pixel unit;
    wherein the forward-reverse scanning circuit comprises a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal;
    wherein the input circuit comprises third to seventh controllable switches and a first capacitor, the control terminal of the third controllable switch receives an open voltage terminal signal and connects the charge compensating circuit, the first terminal of the third controllable switch connects the control terminal of the fourth controllable switch, the second terminal of the first controllable switch, the first terminal of the second controllable switch and the charge compensating circuit, the second terminal of the third controllable switch connects the first terminal of the fifth controllable switch and the output circuit, the second terminal of the fifth controllable switch connects the second terminal of the fourth controllable switch and the second terminal of the seventh controllable switch and receives a close voltage terminal signal, the control terminal of the fifth controllable switch connects the first terminal of the fourth controllable switch, the control terminal of the seventh controllable switch and the first terminal of the sixth controllable switch, the control terminal of the sixth controllable switch connects the second terminal of the sixth controllable switch and the output circuit, the first terminal of the seventh controllable switch connects the output circuit, the first capacitor is connected between the control terminal and the second terminal of the seventh controllable switch;
    wherein the output circuit comprises an eighth controllable switch and a second capacitor, the control terminal of the eighth controllable switch connects the second terminal of the third controllable switch and the first terminal of the fifth controllable switch, the first terminal of the eighth controllable switch connects the control terminal of the sixth controllable switch and the second terminal of the sixth controllable switch and receives the third clock signal, the second terminal of the eighth controllable switch connects the first terminal of the seventh controllable switch and the present level scanning line, the second capacitor is connected between the control terminal of the eighth controllable switch and the second terminal of the eighth controllable switch; and
    wherein the charge compensating circuit comprises a ninth controllable switch and a tenth controllable switch, the control terminal of the ninth controllable switch receives the second upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch receives the second lower scanning signal.

2. The scanning drive circuit according to claim 1, wherein, the third control signal includes a second upper scanning signal and a second lower scanning signal, or the first upper scanning signal and the first lower scanning signal.

3. The scanning drive circuit according to claim 1, wherein the first to tenth controllable switches are N-type thin film transistors, the control terminals, the first terminals and the second terminals of the first to tenth controllable switches respectively correspond to the gate electrodes, the drain electrodes and the source electrodes of the N-type thin film transistors.

4. A scanning drive circuit, comprising a plurality of cascaded scanning driving units, wherein each scanning driving unit comprises:
- a forward-reverse scanning circuit used to receive a first upper scanning signal and a first clock signal and output a first control signal to control a forward scanning of the scanning drive circuit, or used to receive a first lower scanning signal and a second clock signal and output a second control signal to control a reverse scanning of the scanning drive circuit;
- an input circuit connecting the forward-reverse scanning circuit and used to receive the first and second control signal from the forward-reverse scanning circuit and charge a pull-up control signal point and a pull-down control signal point according to the first and second control signal;
- a charge compensating circuit connecting the input circuit and used to receive a third control signal and compensatingly charge the pull-up control signal point and the pull-down control signal point according to the third control signal; and
- an output circuit connecting the input circuit and used to process a received third clock signal and the data received from the input circuit to generate a scanning driving signal, the scanning driving signal being outputted to a present level scanning line for driving a pixel unit;
- wherein the forward-reverse scanning circuit comprises a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal;
- wherein the input circuit comprises third to seventh controllable switches and a first capacitor, the control terminal of the third controllable switch receives an open voltage terminal signal and connects the charge compensating circuit, the first terminal of the third controllable switch connects the control terminal of the fourth controllable switch, the second terminal of the first controllable switch, the first terminal of the second controllable switch and the charge compensating circuit, the second terminal of the third controllable switch connects the first terminal of the fifth controllable switch and the output circuit, the second terminal of the fifth controllable switch connects the second terminal of the fourth controllable switch and the second terminal of the seventh controllable switch and receives a close voltage terminal signal, the control terminal of the fifth controllable switch connects the first terminal of the fourth controllable switch, the control terminal of the seventh controllable switch and the first terminal of the sixth controllable switch, the control terminal of the sixth controllable switch connects the second terminal of the sixth controllable switch and the output circuit, the first terminal of the seventh controllable switch connects the output circuit, the first capacitor is connected between the control terminal and the second terminal of the seventh controllable switch;
- wherein the output circuit comprises an eighth controllable switch and a second capacitor, the control terminal of the eighth controllable switch connects the second terminal of the third controllable switch and the first terminal of the fifth controllable switch, the first terminal of the eighth controllable switch connects the control terminal of the sixth controllable switch and the second terminal of the sixth controllable switch and receives the third clock signal, the second terminal of the eighth controllable switch connects the first terminal of the seventh controllable switch and the present level scanning line, the second capacitor is connected between the control terminal of the eighth controllable switch and the second terminal of the eighth controllable switch; and
- wherein the charge compensating circuit comprises a ninth controllable switch and a tenth controllable switch, the control terminal of the ninth controllable switch connects the first terminal of the first controllable switch and receives the first upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch connects the second terminal of the second controllable switch and receives the first lower scanning signal.

5. The scanning drive circuit according to claim 4, wherein, the first to tenth controllable switches are N-type thin film transistors, the control terminals, the first terminals and the second terminals of the first to tenth controllable switches respectively correspond to the gate electrodes, the drain electrodes and the source electrodes of the N-type thin film transistors.

6. A flat display device, comprising a scanning drive circuit, wherein the scanning drive circuit comprises a plurality of cascaded scanning driving units, and each scanning driving unit comprises:
- a forward-reverse scanning circuit used to receive a first upper scanning signal and a first clock signal and output a first control signal to control a forward scanning of the scanning drive circuit, or used to receive a first lower scanning signal and a second clock signal and output a second control signal to control a reverse scanning of the scanning drive circuit;
- an input circuit connecting the forward-reverse scanning circuit and used to receive the first and second control signal from the forward-reverse scanning circuit and charge a pull-up control signal point and a pull-down control signal point according to the first and second control signal;
- a charge compensating circuit connecting the input circuit and used to receive a third control signal and compensatingly charge the pull-up control signal point and the pull-down control signal point according to the third control signal; and an output circuit connecting the input circuit and used to process a received third clock signal and the data received from the input circuit to generate a scanning driving signal, the scanning driving signal being outputted to a present level scanning line for driving a pixel unit;

wherein the forward-reverse scanning circuit comprises a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal;

wherein the input circuit comprises third to seventh controllable switches and a first capacitor, the control terminal of the third controllable switch receives an open voltage terminal signal and connects the charge compensating circuit, the first terminal of the third controllable switch connects the control terminal of the fourth controllable switch, the second terminal of the first controllable switch, the first terminal of the second controllable switch and the charge compensating circuit, the second terminal of the third controllable switch connects the first terminal of the fifth controllable switch and the output circuit, the second terminal of the fifth controllable switch connects the second terminal of the fourth controllable switch and the second terminal of the seventh controllable switch and receives a close voltage terminal signal, the control terminal of the fifth controllable switch connects the first terminal of the fourth controllable switch, the control terminal of the seventh controllable switch and the first terminal of the sixth controllable switch, the control terminal of the sixth controllable switch connects the second terminal of the sixth controllable switch and the output circuit, the first terminal of the seventh controllable switch connects the output circuit, the first capacitor is connected between the control terminal and the second terminal of the seventh controllable switch;

wherein the output circuit comprises an eighth controllable switch and a second capacitor, the control terminal of the eighth controllable switch connects the second terminal of the third controllable switch and the first terminal of the fifth controllable switch, the first terminal of the eighth controllable switch connects the control terminal of the sixth controllable switch and the second terminal of the sixth controllable switch and receives the third clock signal, the second terminal of the eighth controllable switch connects the first terminal of the seventh controllable switch and the present level scanning line, the second capacitor is connected between the control terminal of the eighth controllable switch and the second terminal of the eighth controllable switch; and wherein the charge compensating circuit comprises a ninth controllable switch and a tenth controllable switch, the control terminal of the ninth controllable switch receives the second upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch receives the second lower scanning signal.

7. The flat display device according to claim 6, wherein, the third control signal includes a second upper scanning signal and a second lower scanning signal, or the first upper scanning signal and the first lower scanning signal.

8. The flat display device according to claim 6, wherein, the first to tenth controllable switches are N-type thin film transistors, the control terminals, the first terminals and the second terminals of the first to tenth controllable switches respectively correspond to the gate electrodes, the drain electrodes and the source electrodes of the N-type thin film transistors.

9. A flat display device, comprising a scanning drive circuit, wherein the scanning drive circuit comprises a plurality of cascaded scanning driving units, and each scanning driving unit comprises:

a forward-reverse scanning circuit used to receive a first upper scanning signal and a first clock signal and output a first control signal to control a forward scanning of the scanning drive circuit, or used to receive a first lower scanning signal and a second clock signal and output a second control signal to control a reverse scanning of the scanning drive circuit;

an input circuit connecting the forward-reverse scanning circuit and used to receive the first and second control signal from the forward-reverse scanning circuit and charge a pull-up control signal point and a pull-down control signal point according to the first and second control signal;

a charge compensating circuit connecting the input circuit and used to receive a third control signal and compensatingly charge the pull-up control signal point and the pull-down control signal point according to the third control signal; and an output circuit connecting the input circuit and used to process a received third clock signal and the data received from the input circuit to generate a scanning driving signal, the scanning driving signal being outputted to a present level scanning line for driving a pixel unit;

wherein the forward-reverse scanning circuit comprises a first controllable switch and a second controllable switch, the control terminal of the first controllable switch receives the first clock signal, the first terminal of the first controllable switch receives the first upper scanning signal, the second terminal of the first controllable switch connects the first terminal of the second controllable switch and the input circuit, the control terminal of the second controllable switch receives the second clock signal, the second terminal of the second controllable switch receives the first lower scanning signal;

wherein the input circuit comprises third to seventh controllable switches and a first capacitor, the control terminal of the third controllable switch receives an open voltage terminal signal and connects the charge compensating circuit, the first terminal of the third controllable switch connects the control terminal of the fourth controllable switch, the second terminal of the first controllable switch, the first terminal of the second controllable switch and the charge compensating circuit, the second terminal of the third controllable switch connects the first terminal of the fifth controllable switch and the output circuit, the second terminal of the fifth controllable switch connects the second terminal of the fourth controllable switch and the second terminal of the seventh controllable switch and receives a close voltage terminal signal, the control terminal of the fifth controllable switch connects the first terminal of the fourth controllable switch, the control terminal of the seventh controllable switch and the first terminal of the sixth controllable switch, the control terminal of the sixth controllable switch connects the second terminal of the sixth controllable switch and the output circuit, the first terminal of the seventh controllable switch connects the output circuit, the first capacitor is connected between the control terminal and the second terminal of the seventh controllable switch;

wherein the output circuit comprises an eighth controllable switch and a second capacitor, the control terminal of the eighth controllable switch connects the second terminal of the third controllable switch and the first terminal of the fifth controllable switch, the first terminal of the eighth controllable switch connects the control terminal of the sixth controllable switch and the second terminal of the sixth controllable switch and receives the third clock signal, the second terminal of the eighth controllable switch connects the first terminal of the seventh controllable switch and the present level scanning line, the second capacitor is connected between the control terminal of the eighth controllable switch and the second terminal of the eighth controllable switch; and wherein, the charge compensating circuit comprises a ninth controllable switch and a tenth controllable switch, the control terminal of the ninth controllable switch connects the first terminal of the first controllable switch and receives the first upper scanning signal, the first terminal of the ninth controllable switch connects the second terminal of the tenth controllable switch and the control terminal of the third controllable switch and receives the open voltage terminal signal, the second terminal of the ninth controllable switch connects the first terminal of the tenth controllable switch, the first terminal of the third controllable switch and the control terminal of the fourth controllable switch, the control terminal of the tenth controllable switch connects the second terminal of the second controllable switch and receives the first lower scanning signal.

10. The flat display device according to claim 9, wherein, the first to tenth controllable switches are N-type thin film transistors, the control terminals, the first terminals and the second terminals of the first to tenth controllable switches respectively correspond to the gate electrodes, the drain electrodes and the source electrodes of the N-type thin film transistors.

* * * * *